United States Patent [19]
Lin et al.

[11] Patent Number: 5,200,362
[45] Date of Patent: Apr. 6, 1993

[54] METHOD OF ATTACHING CONDUCTIVE TRACES TO AN ENCAPSULATED SEMICONDUCTOR DIE USING A REMOVABLE TRANSFER FILM

[75] Inventors: Paul T. Lin; Michael B. McShane, both of Austin, Tex.; Sugio Uchida; Takehi Sato, both of Nagano, Japan

[73] Assignee: Motorola, Inc., Schaumburg, Ill.

[21] Appl. No.: 756,952

[22] Filed: Sep. 9, 1991

Related U.S. Application Data

[63] Continuation of Ser. No. 576,255, Aug. 31, 1990, abandoned.

[30] Foreign Application Priority Data

Sep. 6, 1989 [JP] Japan .................. 1-231323

[51] Int. Cl.⁵ ............... H01L 21/56; H01L 21/58; H01L 21/60
[52] U.S. Cl. .......................... 437/207; 437/211
[58] Field of Search ........... 437/206, 211, 220, 207; 264/272.17; 29/841, 855

[56] References Cited

U.S. PATENT DOCUMENTS

| | | | |
|---|---|---|---|
| 4,530,152 | 7/1985 | Roch et al. | 437/211 |
| 4,635,356 | 1/1987 | Ohuchi et al. | 437/211 |

FOREIGN PATENT DOCUMENTS 6292331 4/1987 Japan ..................... 437/211

Primary Examiner—Olik Chaudhuri
Assistant Examiner—David E. Graybill
Attorney, Agent, or Firm—Jasper W. Dockrey

[57] ABSTRACT

A semiconductor device and a method for its fabrication are disclosed. In a preferred embodiment, a pattern of conductive traces is formed on a film of transfer material. A semiconductor device die is interconnected to the pattern of conductive traces and a resin body is formed around the die, one side of the conductive traces, and the interconnecting means. The film of transfer material forms, at this stage of the process, one side of the package. The film of transfer material is then peeled from the pattern of conductive traces and the resin body to expose the other side of the pattern of conductive traces. Contact to the other side of the pattern provides electrical contact to the senmiconductor device die.

8 Claims, 3 Drawing Sheets

METHOD OF ATTACHING CONDUCTIVE TRACES TO AN ENCAPSULATED SEMICONDUCTOR DIE USING A REMOVABLE TRANSFER FILM

This is a continuation of application Ser. No. 07/576,255, filed Aug. 31, 1990, now abandoned.

BACKGROUND OF THE INVENTION

This invention relates to a resin encapsulated semiconductor device and to a method for its fabrication, and more specifically to a resin encapsulated semiconductor device capable of being fabricated in a thin format.

Semiconductor devices are widely used in various types of electronic products, consumer products, automobiles, integrated circuit cards, and the like. One feature of the semiconductor device which is important in many of these applications, and especially in such applications as the integrated circuit card, is the small size of the semiconductor device.

The semiconductor devices which are used in those various applications are usually packaged by either one of two methods. In one method, a semiconductor device die is placed in a package which is then individually mounted on a circuit substrate. In an alternate method, the semiconductor device die itself is mounted directly on the circuit substrate and then is usually provided with a protective encapsulation structure. The first mentioned method has the advantages that the device die is sealed in and protected by the package. The packaged device is easy to test, handle, and install and the encapsulating package provides the desired degree of protection against the environment. In contrast, the second described method in which the device die is connected directly to the substrate minimizes the area required by the die and thus allows a very high packing density. In this method, however, the device die is less easily handled and tested and is more subject to undesirable effects of the environment.

In selecting either of the above mentioned packaging techniques, it is necessary to compromise in the characteristics of the semiconductor device and the way it is utilized. In addition, either method requires that the semiconductor device be packaged on the interconnecting substrate such as a PC board, and thus has a problem of preventing the reduction in the thickness of the substrate so that the semiconductor device cannot be used in an application such as an IC card which requires an extremely thin substrate.

Thus a semiconductor device and a method for its fabrication were needed which would overcome the limitations of the foregoing semiconductor devices and methods.

BRIEF SUMMARY OF THE INVENTION

This invention provides a highly reliable packaged semiconductor device and a method for its fabrication which achieves a reduction in the thickness of the device without compromising the ease of handling a fully packaged device. In accordance with one embodiment of the invention, a semiconductor device is fabricated by providing a transfer film on which a pattern of conductive traces are provided. A semiconductor device die is interconnected to the pattern of conductive traces and a resin material is provided to encapsulate the semiconductor device die, one side of the pattern of conductive traces, and the electrical interconnections between the traces and the die. The transfer film is then peeled from the encapsulated device and the pattern of conductive traces to expose the underside of the pattern of traces, at least a portion of which is available for making electrical contact to the semiconductor device die.

DETAILED DESCRIPTION OF PREFERRED EMBODIMENTS

Figure 1:
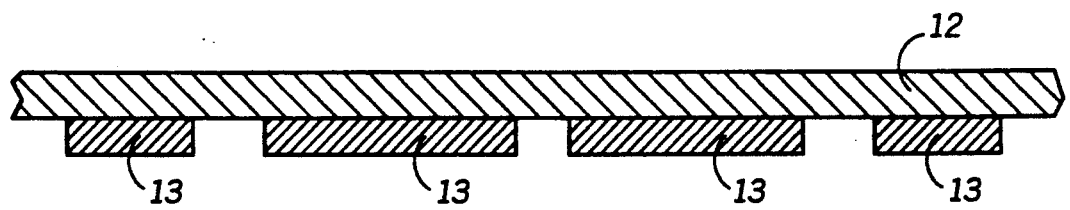
FIGS. 1-4 illustrate, in cross section, process steps in accordance with one embodiment of the invention for the fabrication of a semiconductor device.
Figure 8:
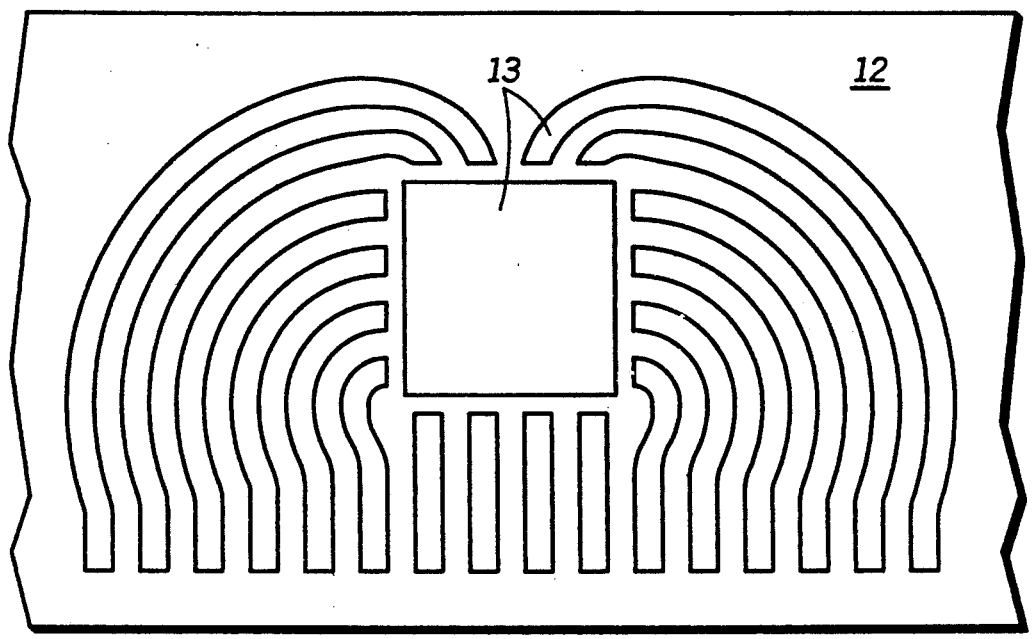
FIG. 8 illustrates a representative pattern of conductive traces on a transfer film.

FIGS. 1-4 illustrate, in cross section, process steps in accordance with one embodiment of the invention. As illustrated in FIG. 1, a transfer film 12 is provided with a pattern of conductive traces 13 on one side of the film. A representative and illustrative pattern of such traces is shown in FIG. 8. Transfer film 12 is a sheet film of flexible material such as "Kapton" or polyester upon which the pattern of conductive traces is formed.

The pattern of conductive traces can be formed in a number of different ways. In accordance with a preferred embodiment of the invention, a foil of conductive material such as copper is laminated to the transfer film 12 and is subsequently patterned using conventional photolithographic patterning and etching. Alternatively, the pattern of conductive traces can be formed, for example, by evaporating a layer of metal or other conductor onto the surface of the transfer film and then patterning that evaporated layer. If the evaporated layer is not of sufficient thickness to reduce the series resistance to a low enough value, the thickness can be increased by plating additional material onto the evaporated film. Still further, the pattern of conductive traces can be formed by first applying a reverse photoresist mask to the transfer film, evaporating a conductive material onto the photoresist and the transfer film, and then using a lift off process to remove the unwanted conductive material. In yet another embodiment, a pattern of traces is formed from a thin sheet of metal and that pattern of traces is then laminated to the transfer film.

Figure 2:
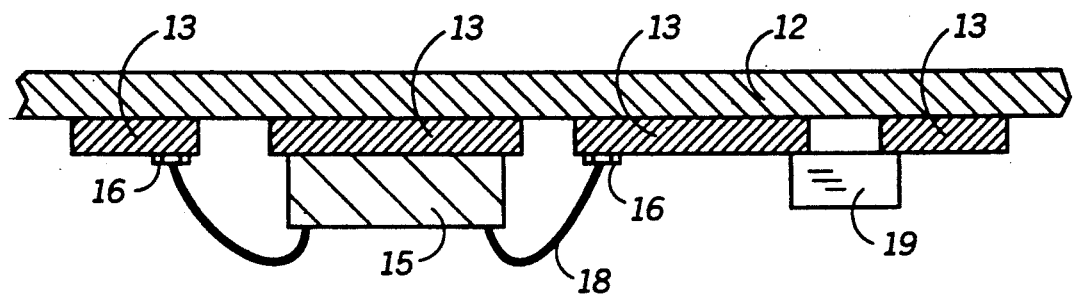

A semiconductor device die 15 is electrically interconnected to the pattern of conductive traces. The interconnection is accomplished by wirebonds 18 or by other conventional means such as TAB tape, or the like. The semiconductor die can be affixed to a portion of the pattern of conductive traces, for example by solder, conductive epoxy, or the like or can be attached to the pattern only by the interconnecting means 18. If the die is attached to a portion of the pattern of conductive traces, that portion can be used, if necessary, as an electrical contact to a substrate of the semiconductor device die. As also illustrated in FIG. 2, additional circuit elements 19 can also be attached to and interconnected with the pattern of conductive traces. Circuit element 19 can be, for example, a resistor, diode, capacitor, or the like. The additional circuit element, which can also be an additional semiconductor device die, can be connected between traces, as illustrated, or can be bonded to the conductive traces as is device die 15.

The portion 16 of the pattern of conductive traces to which the wirebonds or other interconnecting means are joined can be prepared especially to accommodate the attachment of the interconnecting means. For example, the bonding area 16 can be plated with gold, treated to smooth the area, or otherwise treated to enhance the reliability of the interconnection.

Figure 3:
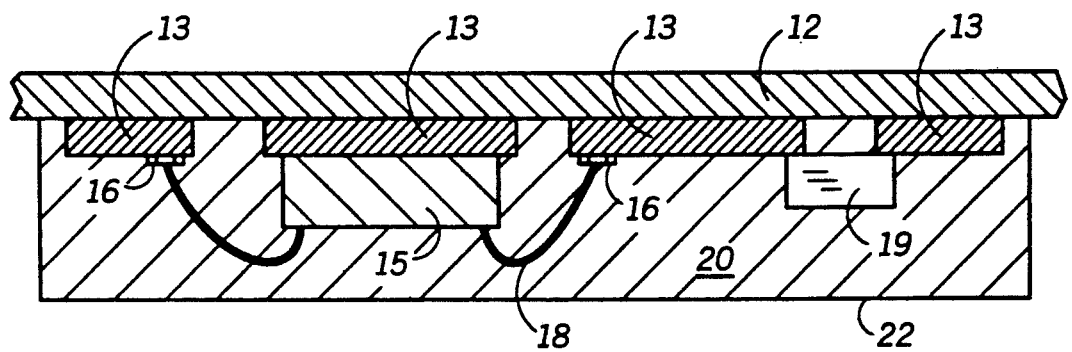

As illustrated in FIG. 3, the process continues by the encapsulation of the semiconductor device die 15, additional circuit element 19, interconnecting means 18, and one side of the pattern of conductive traces by an encapsulating resin 20 to form a protective body 22. Body 22 is formed in conventional manner, such as by transfer molding in which the transfer film 12 with the attached semiconductor device die 15 is inserted into a mold cavity and the encapsulating resin is forced into the cavity at a high temperature and high pressure. Alternatively, body 22 can be made by injection molding, pour molding, or in a "glop top" process. In each of these encapsulating operations, the resin material is formed on one side of transfer film 12; that is, the transfer film, at this stage of the process, forms one side of the package. The resin material thus surrounds the semiconductor device die, the interconnecting means, and one side of the pattern of conductive traces, plus any additional electronic components which are attached to the conductive traces.

Figure 4:
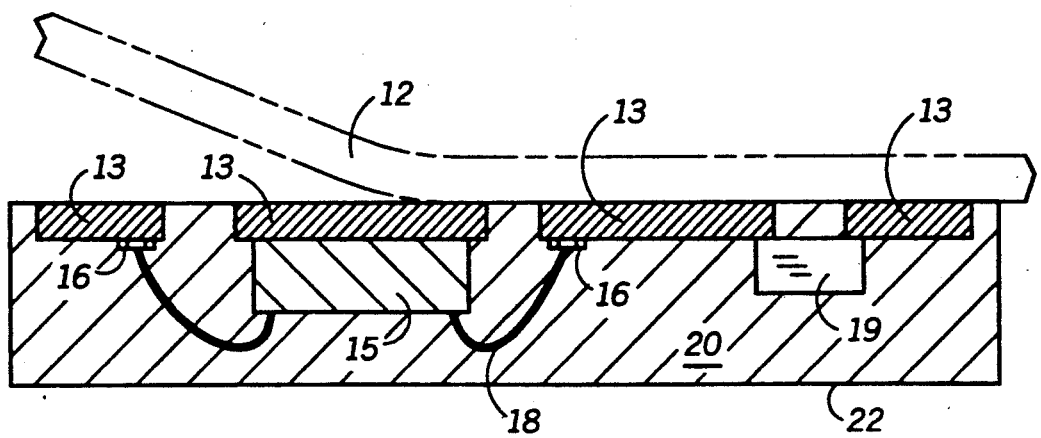

Following the encapsulation operation, as illustrated in FIG. 4, the transfer film 12 is peeled or removed from the surface of the encapsulated device leaving a resin encapsulated device with one side of the conductive traces exposed and available to provide electrical contact to the semiconductor device die. In forming the pattern of conductive traces on transfer film 12, for example by applying a layer of electrolytic copper foil to the transfer film, it is especially advantageous if the surface of the foil which is to contact the transfer film is smooth and the opposite side is rough. The smooth surface facilitates the peeling away of the transfer film after the encapsulation operation and the rough surface enhances the adherence of the resin material to the pattern of conductive traces.

Figure 5:
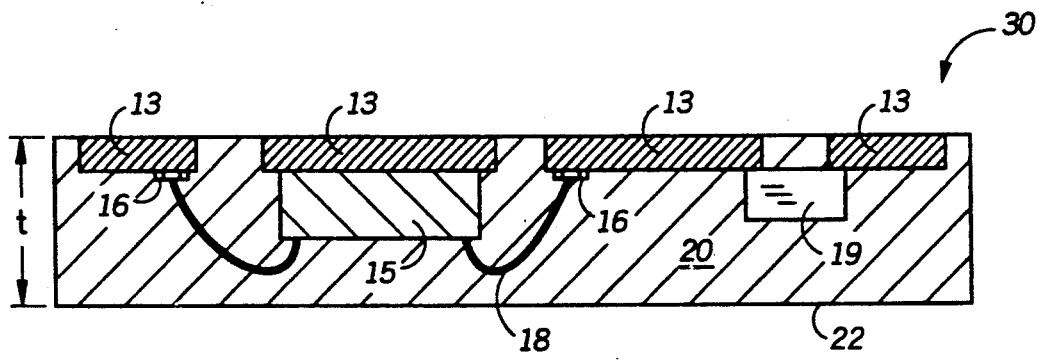
FIGS. 5 and 6 illustrate, in cross section, semiconductor devices in accordance with two embodiments of the invention.

FIG. 5 illustrates, again in cross section, the completed semiconductor device 30 after the transfer film has been removed. Device 30 includes semiconductor device die 15 which is enclosed within an encapsulating resin body 22. Exposed on one side of the resin body are portions of one side of the pattern of conductive traces 13. These conductive traces can be directly contacted for making electrical contact to the semiconductor device die. No thick device "header" or leadframe is necessary for mounting the device die, and so the thickness "t" is minimized. In addition to making contact to the conductive traces for the purpose of making electrical contact, some of the traces, such as trace 13 upon which device die 15 is mounted, can be contacted by a heat sink (not shown) in order to conduct heat away form the die during operation.

Figure 6:
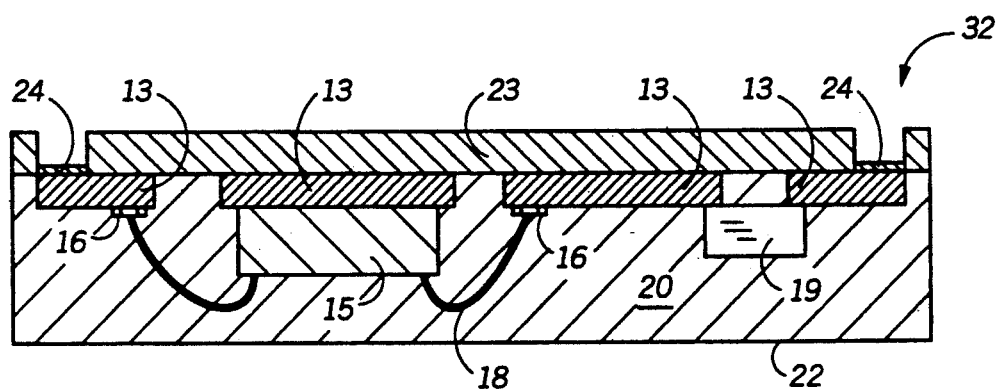

FIG. 6 illustrates, in cross section, a semiconductor device 32 in accordance with an alternate embodiment of the invention. This embodiment is similar to device 30 illustrated in FIG. 5 except that a protective coating 23 is applied to the exposed surface of the pattern of conductive traces 13. The protective coating can be, for example, a low temperature deposited oxide, polyimide, adhesively applied insulating film, or the like. Openings 24 are formed through insulating film 23 to expose selected portions of the pattern of conductive traces. Gold plating or other metallic plating can be applied to the exposed portions of the conductive traces to protect against corrosion of the those exposed portions and also to enhance the ability to electrically contact those portions. In device 32 only the contacts 24 are exposed and the rest of the semiconductor device is encapsulated either by encapsulating body 22 or by the protective film 23.

Figure 7:
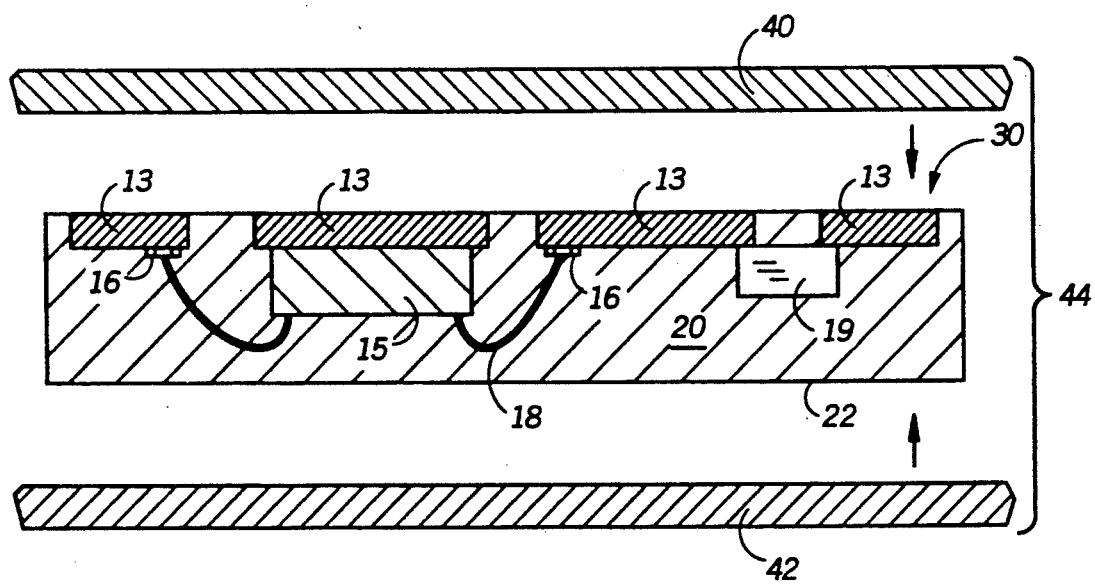
FIG. 7 illustrates schematically the fabrication of an integrated circuit (IC) card.

FIG. 7 illustrates schematically, in exploded view, a further embodiment of the invention. As illustrated in FIG. 7, an IC card structure or the like is fabricated by laminating a device such as device 30 between upper 40 and lower 42 plastic sheets. The three components are laminated together to form an IC card device 44. The term "IC card" is used to describe the debit cards and the like which incorporate an integrated circuit to update the financial or other status of the card as money is deposited or as the card is used. IC device 30 provides the intelligence included within the IC card. The flat plastic sheets 40, 42 provide a useful card size and include identifying information embossed on the faces as well as other information and user interface. The underside of sheet 40 may include a pattern of traces which interface with the pattern of traces 13 on device 30. The traces may be coupled together with solder bumps, conductive epoxy, or the like, or merely by the pressure of the lamination itself. Electrical contacts on the edge of one of the plastic sheets then provides an external electrical access to the device 30. Alternatively, device 30 itself, with a pattern as that illustrated in FIG. 5, may directly provide the external contact. For example, sheet 40 may be provided with a window or windows (not shown) which expose the pattern of traces on device 30 so that contact, for example by a card reader machine, can be made directly to those traces.

Figure 9:
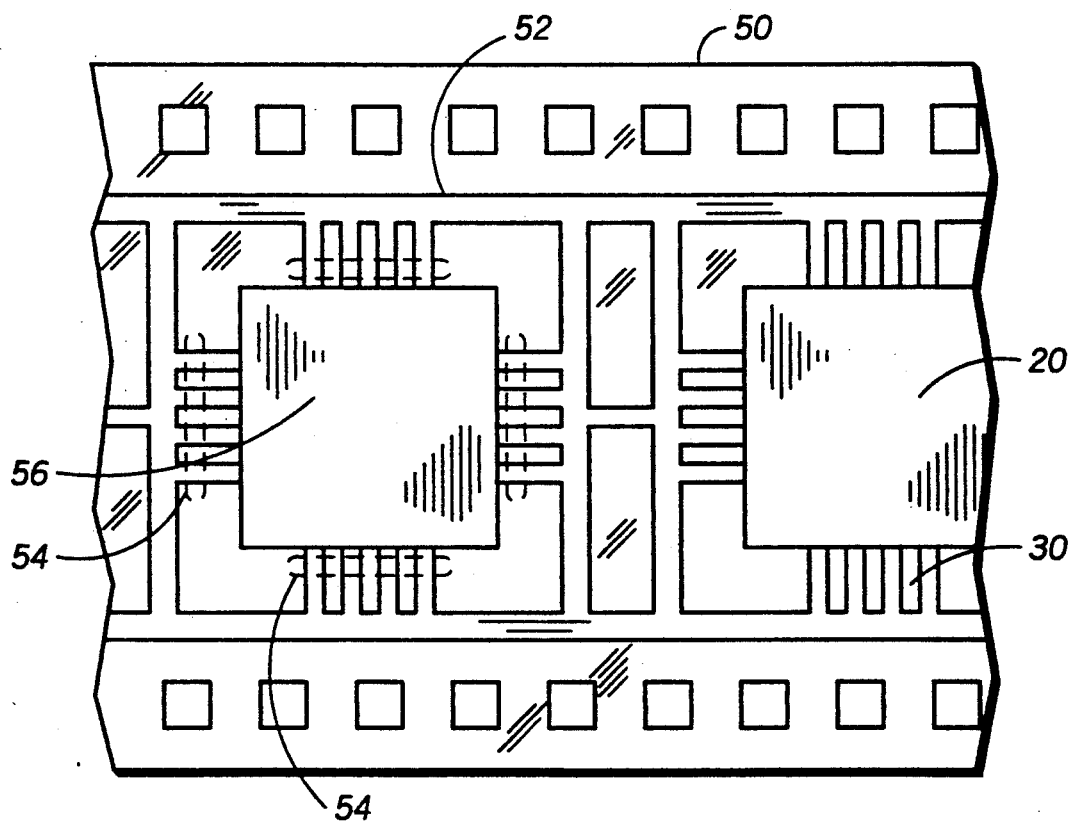
FIG. 9 illustrates the fabrication of a plurality of semiconductor devices on an elongated transfer film in accordance with a further embodiment of the invention.

FIG. 9 illustrates, in plan view, the fabrication of semiconductor devices in accordance with a further embodiment of the invention in which a plurality of devices can be fabricated simultaneously. An elongated transfer film 50 provides a plurality of groups of patterns of conductive traces (parts of two groups are illustrated) on one surface thereof. The conductive traces are interconnected by a bus line 52 which allows the plurality of traces to be electrolytically plated. The patterns of conductive traces can be made, for example, by evaporating a film of conductive material onto the surface of elongated transfer film 50, patterning that evaporated film into the desired pattern, and then electroplating to achieve the desired thickness of conductive material. A semiconductor device die is mounted and interconnected to each of the groups of conductive traces and the die, interconnections, and one side of the conductive traces are encapsulated within a resin body 56. After the resin encapsulation, which is carried out in a manner similar to that described above, the elongated transfer film is peeled off or otherwise removed to expose the reverse side of the conductive traces. Either before or after the transfer film is removed, the traces can be severed along the lines 54 to electrically disconnect the individual devices so that they can be tested.

Thus it is apparent that there has been provided, in accordance with the invention, a semiconductor device and method for its fabrication which overcomes the problems associated with the prior art devices and methods. Although the invention has been described and illustrated with reference to specific embodiments thereof, it is not intended that the invention be limited to these illustrative embodiments. Those skilled in the art will recognize that variations and modifications can be made without departing from the spirit of the invention. For example, other patterns of conductive traces can be used and additional devices can be interconnected as needed. Additionally, other methods for forming both the conductive traces and for the encapsulation of the devices are possible. Thus it is intended to encompass within the invention all such variations and modifications as fall within the scope of the appended claims.

We claim:

1. A process for fabricating a semiconductor device comprising the steps of:
    providing a transfer film;
    providing a pattern of conductive traces on said transfer film;
    providing a semiconductor device die;
    forming electrical interconnections between said pattern of conductive traces and said semiconductor device die;
    providing a resin material on one side of said transfer film to encapsulate said semiconductor device die, said electrical interconnections, and a portion of said pattern of conductive traces; and
    removing said transfer film to expose one side of said pattern of conductive traces.

2. The process of claim 1 further comprising the step of forming a layer of insulating material over portions of said one side and leaving contact areas of said pattern exposed.

3. The process of claim 1 further comprising the step of laminating said semiconductor device die and said resin material between two sheets of plastic material.

4. The process of claim 3 wherein said step of laminating leaves exposed a portion of said one side.

5. The process of claim 4 further comprising the step of plating contact metal onto said exposed portion.

6. The process of claim 1 wherein said step of forming a pattern of conductive traces comprises the steps of:
    forming a continuous layer of conductive material on said transfer film; and
    selectively etching said continuous layer to form said pattern of conductive traces.

7. The process of claim 6 wherein said step of forming a continuous layer comprises laminating a layer of conductive foil to said transfer film.

8. The process of claim 6 wherein said step of forming a continuous layer comprises evaporating a layer of metal onto said transfer film.

* * * * *